(12) United States Patent
Liu et al.

(10) Patent No.: US 11,569,441 B2
(45) Date of Patent: Jan. 31, 2023

(54) MAINTAINING COERCIVE FIELD AFTER HIGH TEMPERATURE ANNEAL FOR MAGNETIC DEVICE APPLICATIONS WITH PERPENDICULAR MAGNETIC ANISTROPY

(71) Applicant: Taiwan Semiconductor Manufacturing Company, Ltd., Hsinchu (TW)

(72) Inventors: Huanlong Liu, Sunnyvale, CA (US); Yuan-Jen Lee, Fremont, CA (US); Jian Zhu, San Jose, CA (US); Guenole Jan, San Jose, CA (US); Luc Thomas, San Jose, CA (US); Po-Kang Wang, Los Altos, CA (US); Ru-Ying Tong, Los Gatos, CA (US); Jodi Iwata, San Carlos, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 222 days.

(21) Appl. No.: 16/876,658

(22) Filed: May 18, 2020

(65) Prior Publication Data

US 2020/0279995 A1 Sep. 3, 2020

Related U.S. Application Data

(60) Continuation of application No. 16/587,927, filed on Sep. 30, 2019, now Pat. No. 10,658,577, which is a
(Continued)

(51) Int. Cl.
*H01L 43/12* (2006.01)
*H01F 10/14* (2006.01)
(Continued)

(52) U.S. Cl.
CPC .............. *H01L 43/12* (2013.01); *H01F 10/14* (2013.01); *H01F 10/32* (2013.01); *H01F 41/14* (2013.01);
(Continued)

(58) Field of Classification Search
CPC ......... H01L 43/02; H01L 43/08; H01L 43/10; H01L 43/12
See application file for complete search history.

(56) References Cited

U.S. PATENT DOCUMENTS 6,544,801 B1 4/2003 Slaughter et al.
8,852,762 B2 10/2014 Abraham et al.
(Continued)

FOREIGN PATENT DOCUMENTS

WO WO 2016178758 11/2016

OTHER PUBLICATIONS

PCT Search Report, International Application No. PCT/US2018/021007, Applicant: Headway Technologies, Inc., dated Jun. 22, 2018, 22 pages.
(Continued)

*Primary Examiner* — Trang Q Tran
(74) *Attorney, Agent, or Firm* — Haynes and Boone, LLP

(57) ABSTRACT

A magnetic tunnel junction with perpendicular magnetic anisotropy (PMA MTJ) is disclosed wherein a free layer interfaces with a tunnel barrier and has a second interface with an oxide layer. A lattice-matching layer adjoins an opposite side of the oxide layer with respect to the free layer and is comprised of $Co_xFe_yNi_zL_wM_v$ or an oxide or nitride of Ru, Ta, Ti, or Si, wherein L is one of B, Zr, Nb, Hf, Mo, Cu, Cr, Mg, Ta, Ti, Au, Ag, or P, and M is one of Mo, Mg, Ta, Cr, W, or V, (x+y+z+w+v)=100 atomic %, x+y>0, and each of v and w are >0. The lattice-matching layer grows a BCC structure during annealing thereby promoting BCC
(Continued)

structure growth in the oxide layer that results in enhanced free layer PMA and improved thermal stability.

20 Claims, 4 Drawing Sheets

Related U.S. Application Data division of application No. 16/022,862, filed on Jun. 29, 2018, now Pat. No. 10,431,736, which is a division of application No. 15/477,288, filed on Apr. 3, 2017, now Pat. No. 10,014,465.

(51) Int. Cl.
| | |
|---|---|
| *H01F 10/32* | (2006.01) |
| *H01F 41/14* | (2006.01) |
| *H01L 43/08* | (2006.01) |
| *H01L 43/02* | (2006.01) |
| *H01L 43/10* | (2006.01) |

(52) U.S. Cl.
CPC .............. *H01L 43/02* (2013.01); *H01L 43/08* (2013.01); *H01L 43/10* (2013.01)

(56) References Cited

U.S. PATENT DOCUMENTS

| | | | |
|---|---|---|---|
| 8,912,614 | B2 | 12/2014 | Vetro et al. |
| 8,946,834 | B2 | 2/2015 | Wang et al. |
| 9,006,704 | B2 | 4/2015 | Jan et al. |
| 9,130,155 | B2 | 9/2015 | Cheputskyy et al. |
| 9,147,833 | B2 | 9/2015 | Pi et al. |
| 9,425,387 | B1 | 8/2016 | Liu et al. |
| 9,966,529 | B1* | 5/2018 | Iwata ...................... H01F 10/16 |
| 2007/0253122 | A1 | 11/2007 | Fukuzawa et al. |
| 2010/0034014 | A1 | 2/2010 | Ohno et al. |
| 2010/0148167 | A1 | 6/2010 | Whig et al. |
| 2012/0018825 | A1 | 1/2012 | Lim et al. |
| 2012/0155156 | A1 | 6/2012 | Watts et al. |
| 2012/0205758 | A1 | 8/2012 | Jan et al. |
| 2012/0236631 | A1 | 9/2012 | Park et al. |
| 2012/0280339 | A1* | 11/2012 | Zhang ................. G11C 11/1675 257/E29.323 |
| 2012/0300542 | A1 | 11/2012 | Uchida et al. |
| 2014/0349415 | A1 | 11/2014 | Oguz et al. |
| 2015/0008547 | A1 | 1/2015 | Pi et al. |
| 2015/0028439 | A1 | 1/2015 | Kula et al. |
| 2015/0311252 | A1 | 10/2015 | Gan et al. |
| 2020/0028073 | A1 | 1/2020 | Liu et al. |

OTHER PUBLICATIONS

Slonczewski, J.C., "Current-driven excitation of magnetic multilayers", Journal of Magnetism and Magnetic Materials 159, L-1-L-7, Elsevier, Jun. 1996.

Garrels, Robert M., "Some Thermodynamic Relations Among the Vanadium Oxides and their Relation to the Oxidation State of the Uranium Ores of the Colorado Plateaus", Aug. 1954, Am. Mineralogist, v. 38, pp. 1251-1265.

Sato, H., et al., "Perpendicular-anisotropy CoFeB—MgO magnetic tunnel junctions with a MfO/CoFeB/Ta/CoFeB/MgO recording structure", Applied Physics Letters, 101, 022414, Jul. 2012, American Institute of Physics.

Ikeda, S., et al., "A perpendicular-anisotropy CoFeB-MgO magnetic tunneljunction", Nature Materials, vol. 9, Sep. 2010, pp. 721-724, DOI: 10.1038/NMAT2804.

Kubota, Hitoshi, et al., "Enhancement of perpendicular magnetic anisotropy in Feb free layers using a thin MgO cap layer", Journal of Applied Physics 111, 07C723, Mar. 2012.

Zhu, Jian-Gang, et al., "Microwave Assisted Magnetic Recording", IEEE Transactions on Magnetics, vol. 44, No. 1, Jan. 2008, pp. 125-131.

PCT Search Report, International Application No. PCT/US2014/042251, Applicant: Headway Technologies, Inc., dated Oct. 13, 2014, 11 pgs.

* cited by examiner

MAINTAINING COERCIVE FIELD AFTER HIGH TEMPERATURE ANNEAL FOR MAGNETIC DEVICE APPLICATIONS WITH PERPENDICULAR MAGNETIC ANISTROPY

PRIORITY DATA

The present application is a continuation application of U.S. patent application Ser. No. 16/587,927, filed Sep. 30, 2019, which is a divisional application of U.S. patent application Ser. No. 16/022,862, filed Jun. 29, 2018, which is a divisional application of U.S. patent application Seer. Ser. No. 15/477,288, filed on Apr. 3, 2017, each of which is herein incorporated by reference in its entirety.

RELATED PATENT APPLICATIONS

This application is related to U.S. Pat. Nos. 9,147,833; and 9,425,387; assigned to a common assignee and herein incorporated by reference in their entirety.

TECHNICAL FIELD

This disclosure relates to magnetic devices with magnetic tunnel junctions (MTJs) having perpendicular magnetic anisotropy (PMA), and in particular, to inserting a lattice-matching layer between a cap layer and top electrode to maintain coercivity (Hc) in the MTJ stack following annealing or during semiconductor processes with high temperatures of about 400° C.

BACKGROUND

Magnetoresistive Random Access Memory (MRAM) has a read function based on a tunneling magnetoresistive (TMR) effect in a MTJ stack wherein a tunnel barrier is formed between a free layer and a reference layer. The free layer serves as a sensing layer by switching the direction of its magnetic moment in response to external fields (media field) while the reference layer has a fixed magnetic moment.

MRAM devices comprised of MTJ elements wherein one or both of the free layer and reference layer have PMA are preferred over their counterparts that employ in-plane anisotropy because the former has an advantage in a lower writing current for the same thermal stability, and better scalability. In MTJs with PMA, the free layer, which stores information for the memory bit, has two preferred magnetization orientations that are perpendicular to the physical plane of the layer. Without external influence, the magnetization direction of the free layer will align to one of the two preferred directions, either up or down, representing information "1" or "0" in the binary system. For memory applications, the free layer magnetization direction is expected to be maintained during a read operation and idle, but change to the opposite direction during a write operation if the new information to store differs from its current memory state. The ability to maintain free layer magnetization direction during an idle period is called data retention or thermal stability and has a different requirement for each memory application. A typical non-volatile memory device may require thermal stability at an elevated temperature of 125° C. for approximately 10 years.

For conventional CoFeB based free layers, PMA originates from the interface between the CoFeB free layer and MgO tunnel barrier. However, the physical shape of the free layer, having a lateral dimension more than ten times the thickness, tends to induce in-plane anisotropy wherein the free layer (FL) magnetization direction will be in the plane of the FL. Moreover, as FL thickness (volume) increases, a greater portion of the free layer is away from the FL/tunnel barrier interface where PMA is generated. Accordingly, PMA is further reduced until at a sufficiently large FL thickness value, FL anisotropy is entirely "in-plane". Thus, thermal stability for MRAM devices with PMA MTJs is limited since the physical law predicts thermal stability is proportional to the product of the coercive field (Hc) and the FL magnetic moment where Hc is the minimum magnetic field needed to reverse the FL magnetization direction. Also, Hc is directly related to PMA in that a larger PMA for the free layer translates to a higher Hc, and vice versa. Although greater free layer thickness provides a higher magnetic moment, the tradeoff is a reduction in PMA and coercivity. In general, there is an optimal free layer thickness for best thermal stability.

Thermal stability is a function of the perpendicular anisotropy field as shown in equation (1) where $k_B$ is the Boltzmann constant, T is the temperature, $M_s$ is the saturation magnetization, and $H_{k_{eff},\perp}$ and V are the out-of-plane anisotropy field and volume, respectively, of the free layer:

$$\Delta = \frac{M_S V H_{k_{eff},\perp}}{2k_B T} \quad (1)$$

and the perpendicular anisotropy field of a magnetic layer is expressed in equation (2) as:

$$H_{k_{eff},\perp} = -4\pi M_s + \frac{2K_U^{\perp,s}}{M_s d} + H_{k,\chi,\perp} \quad (2)$$

where d is the thickness of the free layer, $H_{k_{\chi},\perp}$ is the crystalline anisotropy field in the perpendicular direction, and $K_U^{\perp,s}$ is the surface perpendicular anisotropy of the top and bottom surfaces of the free layer. The shape anisotropy field is represented by the term $(-4\pi M_s)$.

In order to improve thermal stability by increasing the value $K_U^{\perp,s}$, a second free layer/metal oxide interface is commonly introduced on an opposite side of the free layer with respect to the tunnel barrier. The metal oxide may be another MgO layer and is often called a cap layer or a Hk enhancing layer. Thus, a MgO/FL/MgO stack will substantially increase total PMA in the free layer thereby allowing a thicker free layer and higher thermal stability. The cap layer often contacts an uppermost MTJ layer called a hard mask, which in turn connects to a top electrode and through a top electrode array to complementary-metal-oxide-semiconductor (CMOS) units in a memory chip. Hard mask materials are typically metals or alloys such as Ta, Ru, Mo, MnPt, and their conductive oxides and nitrides as required for conventional techniques in manufacturing integrated circuits. The hard mask thickness is often greater than a total thickness of the other MTJ layers, which is generally around 100 Angstroms.

Since MTJ elements are implemented in CMOS devices, a PMA MTJ must be able to withstand annealing temperatures up to about 400° C. for 30 minutes that are commonly applied to improve the quality of the CMOS units for semiconductor purposes. It is widely recognized that interfacial PMA between adjoining CoFeB and MgO layers is optimized when both have a matching body-centered cubic (BCC) structure. During annealing, the amorphous CoFeB and MgO layers usually are transformed from an amorphous state to a BCC structure. However, PMA is easily degraded by diffusion of metal from the hard mask into the cap layer thereby interrupting the BCC formation process in the cap layer. Therefore, an improved MTJ structure is needed that enables the cap layer to achieve a pure BCC structure which in turn leads to enhanced thermal stability for the PMA MTJ at elevated temperatures up to 400° C. that are typical of back end of line (BEOL) semiconductor processes.

SUMMARY

One objective of the present disclosure is to provide a MTJ stack in a magnetic device wherein the free layer has PMA and coercivity (Hc) that is maintained after high temperature processing including annealing at temperatures up to 400° C. for a plurality of hours.

A second objective of the present disclosure is to provide a MTJ stack of layers according to the first objective such that other properties including the TMR ratio, and resistance x area (RA) value are maintained at an acceptable level.

According to one embodiment of the present disclosure, these objectives are achieved by configuring a magnetic tunnel junction with perpendicular magnetic anisotropy (PMA MTJ) with a reference layer (RL)/tunnel barrier/free layer (FL)/oxide layer stack in a bottom spin valve structure to include a lattice-matching layer between the oxide layer (cap layer) and overlying hard mask. The lattice-matching layer enables the cap layer to transform from an amorphous state to a BCC structure in order to match the BCC structure that forms in the free layer thereby providing optimum interfacial magnetic anisotropy at the FL/oxide layer interface. In an alternative embodiment wherein the MTJ has an oxide layer/FL/tunnel barrier/RL stack in a top spin valve structure and the oxide layer serves as a Hk enhancing layer, a lattice-matching layer is inserted between the oxide layer and a bottom electrode. Thus, the free layer interfaces with an oxide layer along both of its top and bottom surfaces to induce or enhance PMA therein. Additional layers may be included such as a seed layer formed at the bottom of the MTJ stack, and a hard mask as the uppermost MTJ layer.

According to one embodiment, the lattice-matching layer is a bilayer wherein a first layer is made of a magnetic material such as $Co_xFe_yNi_zL_w$ wherein L is one of B, Zr, Nb, Hf, Mo, Cu, Cr, Mg, Ta, Ti, Au, Ag, or P, and (x+y+z+w)=100 atomic %, x+y>0, and w>0. The $Co_xFe_yNi_zL_w$ layer contacts the top surface of the oxide layer in a bottom spin valve configuration, or the bottom surface of the oxide layer in a top spin valve configuration. Moreover, there is a second layer that is a non-magnetic metal or alloy that adjoins an opposite side of the first layer with respect to the oxide layer. The second layer is preferably one of Mo, Ta, Mg, Cr, V, Ru, or W. The second layer serves to effectively eliminate a magnetic interaction between the first layer and the free layer, and preferably remains amorphous at temperatures proximate to 400° C., thereby blocking migration of non-magnetic metals from the hard mask, top electrode, or bottom electrode into the $Co_xFe_yNi_zL_w$ layer and preventing a disruption of BCC structure formation therein.

In another embodiment, the lattice-matching layer may be a single layer that is an alloy of the first and second layer materials. For example, during deposition of the metal or alloy M on a $Co_xFe_yNi_zL_w$ layer, the latter may be resputtered to form a layer represented by $Co_xFe_yNi_zL_wM_v$ where each of w and v is >0. In this case, a lower concentration of M may be formed proximate to the cap layer than in an upper portion of the lattice-matching layer. In yet another embodiment, the deposition of the M material is controlled to an extent that only an upper portion of the first layer is resputtered. As a result, a $Co_xFe_yNi_zL_w/Co_xFe_yNi_zL_wM_v/M$ trilayer stack may be formed on the cap layer in a bottom spin valve configuration.

The present disclosure also encompasses an embodiment where the lattice matching layer has a bilayer or trilayer configuration wherein a first layer that is an oxide or nitride of Ru, Ta, Ti, or Si has a first surface that adjoins the oxide layer, and a second surface opposite to the first surface that contacts a second layer comprised of one or more M elements that are Mo, Ta, Mg, Cr, V, Ru, and W, or contacts a stack with a $Co_xFe_yNi_zL_w/M$ composition.

In a PMA MTJ with a top spin valve configuration, an optional seed layer is formed on a bottom electrode. When the seed layer is omitted, the second layer comprised of the metal or alloy M may serve as the seed layer on the bottom electrode. Moreover, a plurality of M materials may be deposited such that the second layer is a bilayer or trilayer, for example. Thereafter, the first layer made of $Co_xFe_yNi_zL_w$ is deposited on the second layer to give a $M/Co_xFe_yNi_zL_w$ bilayer configuration for the lattice-matching layer. In some embodiments, a certain amount of the second layer is resputtered to yield a $M/Co_xFe_yNi_zL_wM/Co_xFe_yNi_zL_w$ trilayer configuration for the lattice-matching layer, or the M layer may be completely resputtered and then co-deposited with the $Co_xFe_yNi_zL_w$ alloy to yield a single lattice-matching layer with a $Co_xFe_yNi_zL_wM_v$ composition.

The free layer may be a single layer made of Co, Fe, or an alloy thereof with one or more elements including Ni and B. In an alternative embodiment, the free layer has two magnetic layers FL1 and FL2 separated by an antiferromagnetic coupling layer such as Ru, or separated by a non-magnetic insertion layer that is Ta or the like which serves as a moment diluting layer. A reference layer adjoins a surface of the tunnel barrier that is opposite the free layer. In a preferred embodiment, the reference layer has a synthetic antiparallel (SyAP) configuration wherein two magnetic layers called AP1 and AP2 are antiferromagnetically coupled through a Ru layer, for example.

After all of the layers in the MTJ are laid down, conventional processing is employed to convert the MTJ stack into a plurality of MTJ elements. In a subsequent step, an anneal process that comprises a temperature of about 400° C. is performed to transform the amorphous character of the free layer, tunnel barrier, and oxide layer to a BCC crystal structure thereby enhancing free layer PMA.

DETAILED DESCRIPTION

Figure 1:
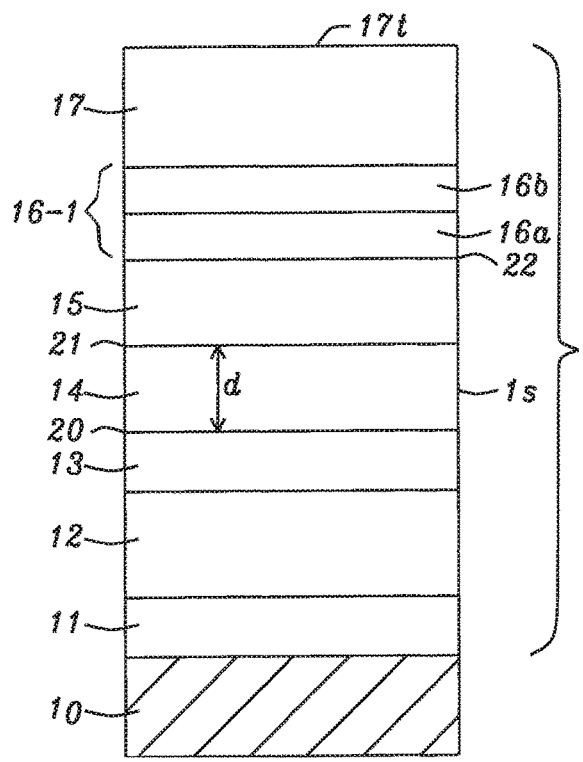
FIG. 1 is a cross-sectional view of a PMA MTJ with a bottom spin valve design wherein a lattice-matching layer having a bilayer structure is formed between a cap layer and top electrode according to a first embodiment of the present disclosure.

The present disclosure is a PMA MTJ element wherein a free layer has thermal stability to at least 400° C. because of perpendicular magnetic anisotropy (PMA) therein that is established by interfaces with a tunnel barrier and an oxide layer, and wherein a lattice-matching layer enables the oxide layer to transform to a BCC structure in order to match the BCC structure formed in the free layer. The PMA MTJ element may be employed in magnetic memory devices such as MRAM and spin-torque MRAM, and in spintronic devices such as microwave assisted magnetic recording (MAMR), spin torque oscillator (STO), magnetic sensors, and biosensors. The PMA MTJ may have a bottom spin valve, top spin valve, or dual spin valve design as appreciated by those skilled in the art. Although a plurality of PMA MTJ elements is typically formed on a substrate during the fabrication of a memory device, only one PMA MTJ is depicted in the exemplary embodiments in order to simplify the drawings. The terms "Hk enhancing layer" and "cap layer" may be used interchangeably when referring to an oxide layer that induces PMA in an adjoining free layer. A cap layer as defined herein has a position above the free layer in a PMA MTJ stack, and a Hk enhancing layer may contact either a bottom surface of the free layer in a top spin valve, or the top surface of the free layer in a bottom spin valve design.

In related U.S. Pat. No. 9,147,833, we disclosed the use of a laminated Hk enhancing layer to achieve high coercivity in PMA MTJ elements after 400° C. annealing. In U.S. Pat. No. 9,425,387, we disclosed a PMA MTJ in which a diffusion barrier is inserted between the Hk enhancing layer and overlying hard mask in order to prevent metals in the hard mask from migrating into the Hk enhancing layer and diluting the interfacial PMA established at the free layer/Hk enhancing layer interface. In other words, high oxygen content is maintained in the Hk enhancing layer by blocking metals from entering therein. Accordingly, better coercivity and higher thermal stability are realized.

Now we have found that coercivity (Hc) in a PMA MTJ with a tunnel barrier/free layer/metal oxide stack of layers is further improved with a layer hereafter called the lattice-matching layer that adjoins the oxide layer on a side facing away from the free barrier, and has a key feature of ensuring that the oxide layer will be completely transformed from an amorphous state to a body-centered cubic (BCC) structure. It should be understood that a tunnel barrier such as MgO is transformed into a BCC layer during annealing and thereby assists the adjoining free layer in achieving a BCC structure through a first interface. The growth of a BCC structure in both of the free layer and lattice-matching layer will influence a similar BCC growth in the oxide layer during high temperature annealing or processing at about 400° C. As a result of BCC lattice matching between the tunnel barrier and free layer, and between the free layer and oxide layer, a greater level of PMA is achieved and maintained in the free layer. The oxide layer may be a cap layer formed between the free layer and overlying hard mask in embodiments depicted in FIGS. 1-4, or a Hk enhancing layer between the bottom electrode and free layer in another set of embodiments shown in FIGS. 5-8.

Referring to FIG. 1, a PMA MTJ 1 with sidewall 1s is shown according to a first embodiment of the present disclosure in which an optional seed layer 11, reference layer 12, tunnel barrier 13, free layer 14, cap layer 15, lattice-matching layer 16, and hard mask 17 are sequentially formed on a bottom electrode 10 in a MRAM, STT-MRAM, or spintronic device. The bottom electrode may be formed on a substrate (not shown) that in some embodiments is a semiconductor structure that may include transistors and other associated control devices. In a STO device, the bottom electrode may be a main pole layer. All layers are typically sputter deposited in a sputter deposition mainframe that has at least one oxidation chamber and an etching chamber. In a preferred embodiment, the tunnel barrier is formed by a first step of depositing a first metal layer, a second step of performing a natural oxidation or radical oxidation to transform the first metal to a first metal oxide, and then depositing a second metal on the first metal oxide. The first and second steps may be repeated before depositing an uppermost metal layer. During a subsequent anneal process, the second or uppermost metal layer absorbs oxygen from the free layer and the underlying metal oxide layer to generate a substantially uniform metal oxide layer. It should be understood that in a STO device, the reference layer serves as a spin injection layer (SIL) and free layer functions as a field generation layer (FGL).

Preferably, seed layer 11 is employed to maintain or enhance PMA in reference layer 12 and facilitates smooth and uniform crystalline growth in the overlying PMA MTJ layers. The seed layer may be one or more of NiCr, NiFeCr, Pd, Pt, Ta, Ru, Mg, Ti, Mo, or other metals or alloys used in the art.

Reference layer 12 preferably is a SyAP stack of layers having an AP2/coupling layer/AP1 configuration wherein the AP1 layer has an interface with the tunnel barrier, and each of AP1 and AP2 are one or more of Co, Fe, CoFe, or alloys thereof that may have an additional element including one or both of Ni and B. AP1 and AP2 layers have magnetic moments in opposite directions because of antiferromagnetic (AFM) coupling provided by a Ru, Rh, Ir or another AFM coupling layer. PMA is induced or enhanced in the reference layer 12 through an interface with tunnel barrier 13. In another embodiment, one or both of the AP1 and AP2 layers are a laminated structure that is one of (Co/Ni)$_n$, (Co/Pd)$_n$, (Co/Pt)$_n$, (CoFe/Ni)$_n$, (Co/NiFe)$_n$, (Co/NiCo)$_n$, or other laminated stacks exhibiting intrinsic PMA where n is between 2 and 30. Preferably, each Co or Co alloy layer in the laminated structure has a thickness between 0.5 and 5 Angstroms while each Pd, Pt, Ni, or Ni alloy layer has a thickness from 2 to 10 Angstroms. The Co or Co alloy layer is generally thinner than the Ni, Ni alloy, Pt, or Pd layer.

When the AP1 layer comprises one of the aforementioned laminated structures, a transition layer that is Co, CoFe, or CoFeB may be inserted as the uppermost layer in the AP1 stack. In some embodiments, a CoFeB/Co transition layer may be formed in which the CoFeB portion is from 4 to 8 Angstroms thick while the Co layer portion has a thickness from 3 to 5 Angstroms. Co is often used as the uppermost layer in the reference layer stack to form an interface with the tunnel barrier layer since Co is more resistant to oxidation than a CoFeB (or CoFe) layer. In other words, oxygen is able to migrate out of a MgO tunnel barrier layer into a reference layer during annealing thereby causing partial oxidation of CoFeB, for example, which leads to a degradation in the TMR ratio.

The tunnel barrier layer 13 may be any metal oxide layer that induces a spin dependent tunneling effect between the reference layer and free layer. Although MgO is often preferred since it provides an optimum TMR ratio, other materials including MgN, MgON, and oxides, nitrides, or oxynitrides of Al, Ti, Zn, Hf, AlTi, MgZn, MgTa, or Ta may be employed as the tunnel barrier. Furthermore, laminations of one or more of the aforementioned materials may be selected as the tunnel barrier.

The free layer 14 adjoins a top surface of the tunnel barrier 13 in a bottom spin valve design, and according to one embodiment is a single layer that is one of Co, Fe, CoFe, or alloys thereof with an optional additional element including one or both of Ni and B. However, the free layer may have a bilayer or trilayer configuration represented by FL1/FL2 or FL1/FL2/FL3 where each of FL1, FL2, and FL3 are magnetic layers made of Co, Fe, CoFe or alloys thereof wherein magnetic moments of all the two or three layers are aligned in the same direction through ferromagnetic coupling. The alloys may include one or both of Ni, B, and transition metal elements including Ta, Zr, Hf, Mg, Mo, and Nb. In other embodiments, the free layer has a FL1/Ru/FL2 configuration wherein FL1 and FL2 layers are antiferromagnetically coupled. In yet another embodiment, the free layer is one of the laminated structures described previously with respect to reference layer composition. A laminated structure that is (Co/Ni)$_n$ or the like is considered to have intrinsic PMA.

In some embodiments, the free layer 14 has a FL1/A/FL2 stack in which A is layer with a thickness from 5 to 10 Angstroms and is made of a non-magnetic element such as Ta, Ti, W, Zr, Hf, Nb, Mo, V, Mg, or Cr that provides a moment dilution effect. The FL1 and FL2 layers are ferromagnetically coupled through the A layer. In other words, for a fixed free layer thickness d, a FL1/A/FL2 configuration will have a smaller in-plane magnetization component than a FL1/FL2 stack. It follows that interfacial perpendicular anisotropy at the interface 20 between the tunnel barrier and free layer, and at the interface 21 between the free layer and cap layer more easily overcomes the shape anisotropy field and generates substantial PMA in the free layer with a FL1/A/FL2 configuration.

PMA in the free layer is induced or enhanced by interfacial perpendicular anisotropy generated in a portion thereof adjacent to a first interface 20 with the tunnel barrier layer 13, and in a portion adjacent to a second interface 21 with an Hk enhancing layer also known in bottom spin valve designs as cap layer 15. Preferably, interfacial (surface) perpendicular anisotropy exceeds the shape anisotropy field for the free layer to provide PMA and a net magnetization direction that is perpendicular to the two interfaces. As a result, the free layer will have greater thermal stability, and higher Hc after high temperature processing up to about 400° C. than a free layer with in-plane magnetization. Note that the thickness of free layer 14 is represented by "d" in equation (4) presented previously. Thus, as the value for "d" is reduced, the perpendicular anisotropy field increases. We have found that PMA is established in the free layer by maintaining thickness d in FIG. 1 in the 5 to 25 Angstrom range. In many free layer configurations, if thickness d is greater than about 25 Angstroms, then the shape anisotropy field is too large to be overcome by an out-of plane component, and the net magnetization of the free layer remains in-plane.

Cap layer 15 is formed on the free layer 14 and is preferably comprised of an oxide that is one of MgTaOx, MgO, SiOx, SrTiOx, BaTiOx, CaTiOx, LaAlOx, MnOx, VOx, Al$_2$O$_3$, TiOx, BOx, and HfOx. In some embodiments, the cap layer is a lamination of one or more of the aforementioned oxides. Preferably, the cap layer is MgO having a non-stoichiometric oxidation state wherein a certain number of Mg atoms remain unoxidized in order to achieve a RA value therein that is less than about 1 ohm-μm$^2$, which is substantially less than the RA value of the tunnel barrier. In some cases, the total RA for the PMA MTJ represented by the sum (RA$_{tunnel\ barrier}$+RA$_{cap\ layer}$) is <5 ohm-μm$^2$ while in other embodiments, the total RA value is below 20 ohm-μm$^2$. The cap layer may be formed by a process similar to the one used in tunnel barrier formation in which a metal or alloy layer is deposited and is then oxidized to a stoichiometric or non-stoichiometric oxidation state by a radical oxidation (ROX) or natural oxidation (NOX) process. Since the oxide cap layer contributes to resistance x area (RA) value for the PMA MTJ but does not increase the TMR ratio, the thickness of the cap layer is preferably minimized to a value of 2 to 20 Angstroms to avoid an unacceptably high total RA value.

A key feature of the present disclosure is a lattice-matching layer 16 formed between the cap layer and an overlying hard mask 17. The lattice-matching layer serves to block the structural influence of the hard mask during subsequent high temperature processing including annealing at 400° C. for a plurality of hours. As a result, the cap layer is transformed from an amorphous character to a BCC structure while the free layer grows a BCC structure during 400° C. processing. Accordingly, higher PMA is achieved in the free layer due to lattice matching with the cap layer. In the prior art, the hard mask metal or alloy is in contact with the oxide cap layer and has a tendency to prevent some or the entire cap layer from forming a BCC structure, and thereby limiting PMA in the free layer.

In the first embodiment, the lattice-matching layer 16-1 has a bilayer structure with a lower layer 16a made of a magnetic material and a thickness of 2 to 10 Angstroms, and an upper layer 16b that is a single layer or multilayer stack comprised of one or more non-magnetic metals or alloys of M elements where M is one or more of Mo, Mg, Ta, Cr, W, Ru, or V. The upper layer serves to effectively eliminate a magnetic influence of the lower layer on the free layer so that the lower layer does not affect switching behavior in the free layer. The lower layer preferably has a $Co_XFe_YNi_ZL_W$ composition wherein L is one of B, Zr, Nb, Hf, Mo, Cu, Cr, Mg, Ta, Ti, Au, Ag, or P, and (x+y+z+w)=100 atomic %, x+y>0, and w>0. Lower layer 16a has a finite magnetic moment after the aforementioned 400° C. annealing process. Moreover, "x" and "z" may be zero to yield a FeL lower layer, or "y" and "z" may be zero to give a CoL lower layer. The L content is relied on to provide an amorphous character in the deposited lower layer, and enables BCC growth in the lower layer during 400° C. annealing.

Since the cap layer is thin as described earlier, the lower layer's magnetic moment is proximate to the free layer and would normally affect the PMA MTJ through either a magnetic dipole field or spin polarization under electric current. However, forming the M layer with a thickness of 2 to 10 Angstroms on a top surface of the lower layer removes any undesirable influence of the lower layer on the free layer. During annealing, the CoFeNiL layer grows a BCC structure and thereby induces a similar BCC growth in cap layer 15 through interface 22. BCC crystal growth is usually complete after 30 minutes at a temperature proximate to 400° C. However, as the non-magnetic element L content increases, the time required for the transformation from amorphous to a BCC structure may increase.

Above the lattice-matching layer 16-1 is a hard mask 17 with a thickness in the range of about 50 to 300 Angstroms, and having a top surface 17t. The hard mask acts as a protective layer to underlying PMA MTJ layers during subsequent processing including photoresist patterning and etching (FIG. 8), and offers resistance to chemicals and abrasives during a chemical mechanical polish (CMP) process shown in FIG. 11 where a top surface of the hard mask is planarized such that it is coplanar with an adjoining insulation layer. The hard mask also serves as an electrical connection from the PMA MTJ to top electrode 40 (FIG. 12) and provides substantial resistance to oxidation. The hard mask is preferably made of one or more of Ta, Ru, Ti, Mo, or MnPt, or a conductive oxide, oxynitride, or nitride thereof.

Figure 2:
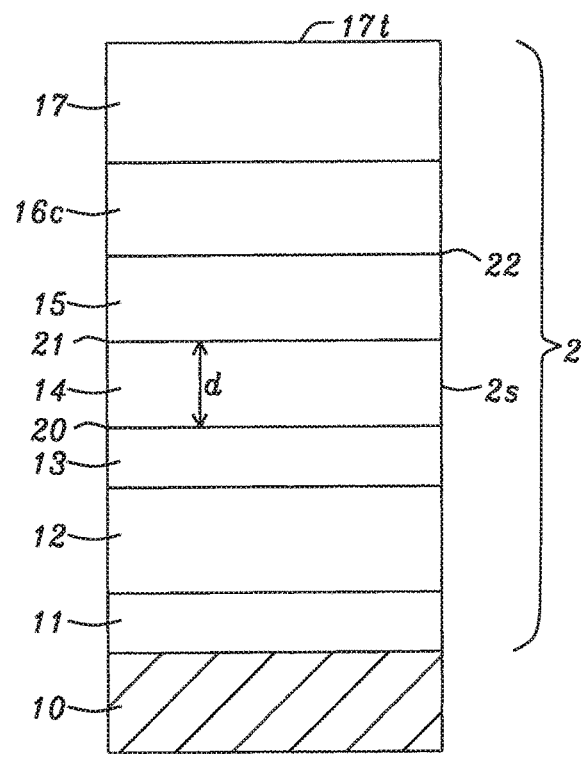
FIG. 2 is a cross-sectional view of a PMA MTJ with a bottom spin valve design wherein a lattice-matching single layer is formed between a cap layer and top electrode according to a second embodiment of the present disclosure.

According to a second embodiment shown in FIG. 2, PMA MTJ 2 having sidewall 2s retains all the layers previously described in the first embodiment with the exception of the lattice-matching layer. The present disclosure anticipates that depositing the M layer on a lower layer 16a may resputter essentially all of the lower layer such that the magnetic material and M element are co-deposited on the cap layer 15 to yield a single lattice-matching layer 16c having a thickness of 2 to 10 Angstroms, and with a $Co_XFe_YNi_ZL_WM_V$ composition wherein (x+y+z+w+v)=100 atomic %, x+y>0, and each of v and w are >0. Here, the M content may be responsible for generating a net non-magnetic character in the lattice-matching layer. In some embodiments, the M content may be uniformly distributed within the CoFeNiLM layer. In other embodiments, the M content in lattice-matching layer 16c may be less in a lower portion thereof that is proximate to the cap layer than in an upper portion that is proximate to hard mask 17. During annealing, the CoFeNiLM layer grows a BCC structure and thereby induces a similar BCC growth in cap layer 15 through interface 22. It should be understood that as the non-magnetic content (v+w atomic %) increases in layer 16c, the time required to complete the BCC growth in the lattice-matching layer will also increase.

Figure 3:
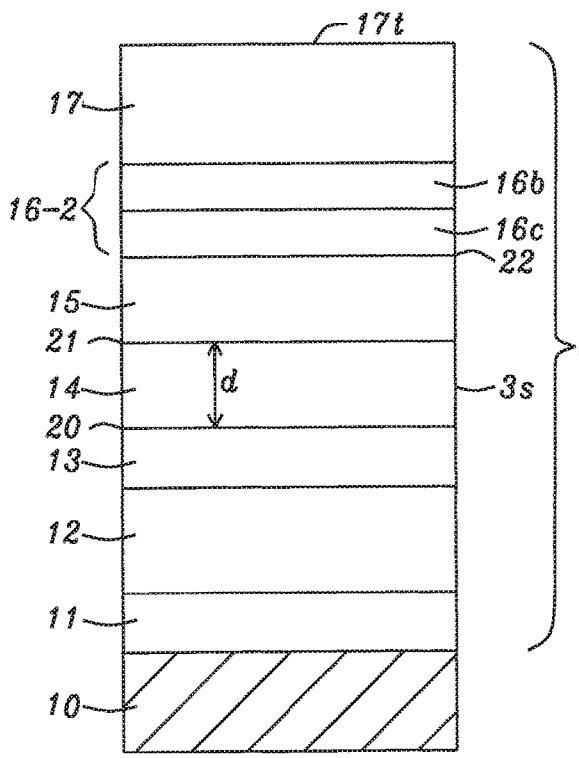
FIG. 3 is a cross-sectional view of a PMA MTJ with a bottom spin valve design wherein a lattice-matching layer having a bilayer structure is formed between a cap layer and top electrode according to a third embodiment of the present disclosure.

In a third embodiment shown in FIG. 3, the deposition of a M material on a $Co_XFe_YNi_ZL_W$ layer may not only form a $Co_XFe_YNi_ZL_WM_V$ layer 16c that has an interface 22 with the cap layer 15, but may also yield a M layer 16b on the $Co_XFe_YNi_ZL_WM_V$ layer to give a lattice-matching layer 16-2 with a bilayer stack having a 16c/16b configuration. Each of layers 16b, 16c has a thickness from 2 to 10 Angstroms in PMA MTJ 3 with sidewall 3s. As in the previous embodiment, the CoFeNiLM layer grows a BCC structure during high temperature annealing proximate to 400° C. thereby promoting a BCC growth in the adjoining cap layer.

Figure 4:
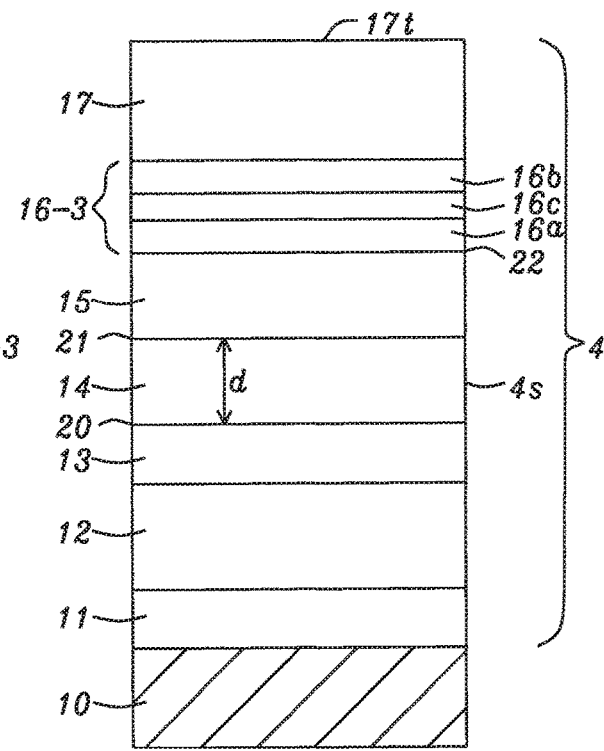
FIGS. 4-5 are cross-sectional views of PMA MTJs with a bottom spin valve design wherein a lattice-matching with a trilayer stack is formed between a cap layer and top electrode according to fourth and fifth embodiments of the present disclosure.

The present disclosure also encompasses a fourth embodiment depicted in FIG. 4 where PMA MTJ 4 with sidewall 4s retains all layers in PMA MTJ 1 except the lattice-matching layer 16-3 has a trilayer configuration. In particular, the M deposition process may be controlled to an extent where only an upper portion of lower layer 16a is resputtered to form a $Co_XFe_YNi_ZL_WM_V$ alloy layer 16c on layer 16a. Furthermore, a M layer 16b may be formed on a top surface of layer 16c to give a 16a/16c/16b stack represented by a CoFeNiL/CoFeNiLM/M configuration for the lattice matching layer 16-3. Alternatively, the M layer deposition may resputter an upper portion of the lower layer to yield a 16a/16c bilayer with a CoFeNiL/CoFeNiLM configuration for lattice matching layer 16-3.

Figure 5:
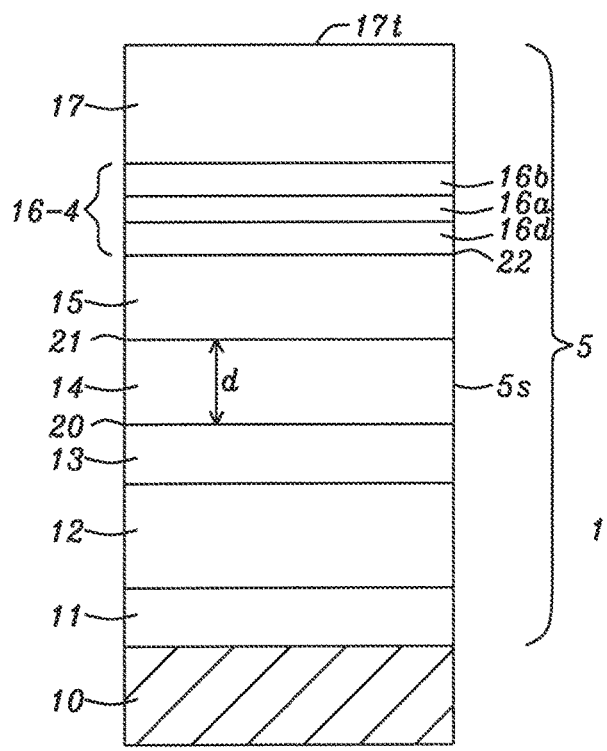

A fifth embodiment of the present disclosure is shown in FIG. 5 and is a modification of the first embodiment. In particular, a lattice matching layer 16d that is an oxide or nitride of Ru, Ta, Ti, or Si may be inserted between lattice matching layer 16a and oxide layer 15 to yield a PMA MTJ 5 with sidewall 5s. Preferably, layer 16d is amorphous as deposited and grows a BCC structure during high temperature annealing to promote BCC growth in the adjoining oxide layer. Moreover, lattice matching layer 16d may be conductive to avoid an additional contribution to total RA value. When lattice matching layer 16d is conductive, the thickness of layer 16d may be up to 80 Angstroms such that a total thickness of stack 16-4 is from 2 to 100 Angstroms. Thus, the lattice matching layer stack 16-4 has a trilayer configuration represented by 16d/16a/16b where layer 16b contacts hard mask 17. In an alternative embodiment, layer 16a may be omitted to provide a 16d/16b bilayer configuration such as TiN/Ru, for example.

Figure 6:
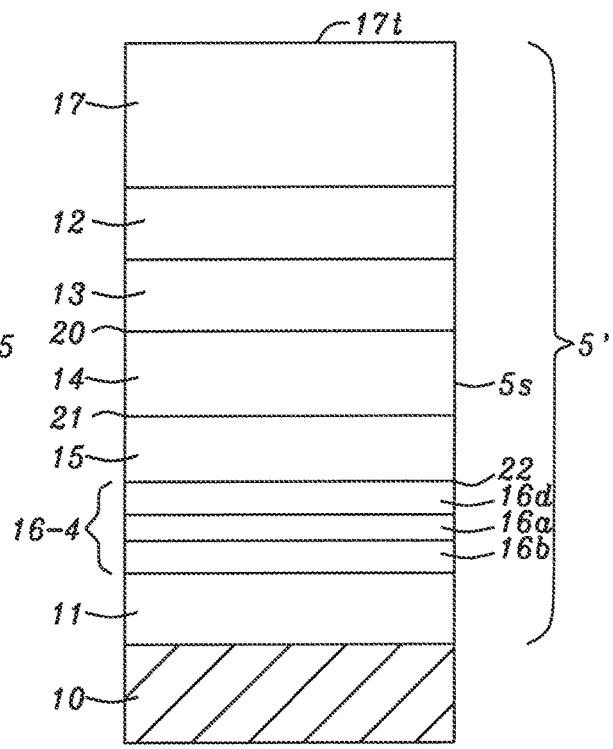
FIG. 6 is a cross-sectional view of a PMA MTJ with a top spin valve design wherein a lattice matching layer with a trilayer structure is formed between a Hk enhancing layer and bottom electrode (BE) according to a sixth embodiment of the present disclosure.

FIG. 6 is a sixth embodiment of the present disclosure that comprises all of the MTJ layers in FIG. 5 except PMA MTJ 5' has a top spin valve configuration wherein the optional seed layer 11, layer 16b, optional layer 16a, and layer 16d, Hk enhancing layer 15, free layer 14, tunnel barrier 13, reference layer 12, and hard mask 17 are sequentially formed on bottom electrode 10. In some embodiments, the seed layer is omitted since the single layer or multilayer of M elements in layer 16b may serve as an acceptable seed layer.

Figure 7:
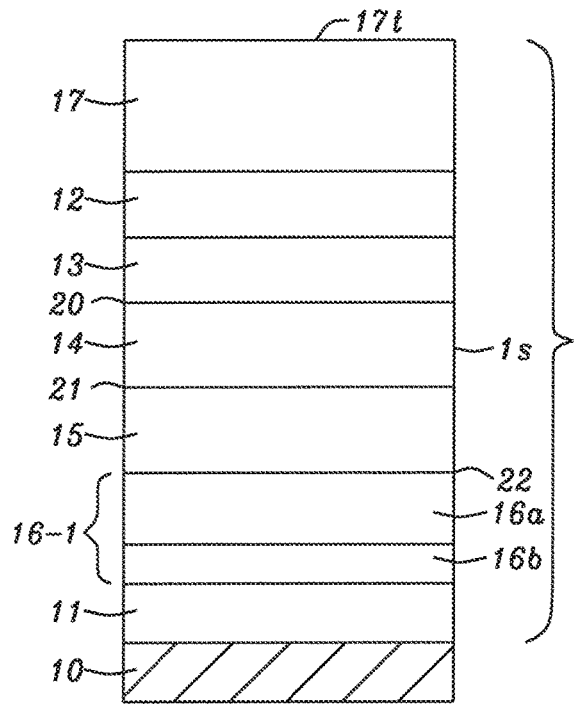
FIG. 7 is a cross-sectional view of a PMA MTJ with a top spin valve design wherein a lattice matching layer having a bilayer structure is formed between a Hk enhancing layer and a bottom electrode according to a seventh embodiment of the present disclosure.

The present disclosure also anticipates a seventh embodiment with a top spin valve configuration as illustrated for PMA MTJ 1' with sidewall 1s in FIG. 7. All layers are retained from FIG. 1 except the order of formation is different. In particular, an optional seed layer 11, lattice-matching layer 16-1, Hk enhancing layer 15, free layer 14, tunnel barrier 13, reference layer 12, and hard mask 17 are sequentially formed on bottom electrode 10. There is a first interface 21 between a bottom surface of the free layer and a top surface of the Hk enhancing layer, and a second interface 20 between a top surface of the free layer and a bottom surface of the tunnel barrier that generate interfacial perpendicular anisotropy and PMA in the free layer. In some embodiments, seed layer 11 is omitted since the one or more M elements in layer 16b effectively serves as a seed layer that promotes uniform growth in overlying layers. In this embodiment, $Co_XFe_YNi_ZL_W$ layer 16a is formed on a top surface of the M layer 16b, and interface 22 is at a lower surface of Hk enhancing layer 15, and at an upper surface of layer 16a. A similar advantage to that associated with bottom spin valve embodiments in FIGS. 1-5 is realized. Namely, greater PMA in free layer 14 is achieved as a result of BCC growth in layer 16a during annealing that induces a similar BCC growth in the Hk enhancing layer. As a result of transforming essentially all of the amorphous character in the Hk enhancing layer to a BCC structure, there is a higher degree of interfacial perpendicular anisotropy at interface 21 and improved lattice matching with the free layer. Accordingly, thermal stability and coercivity in the free layer are maintained after high temperature processing around 400° C. for a plurality of hours.

Figure 8:
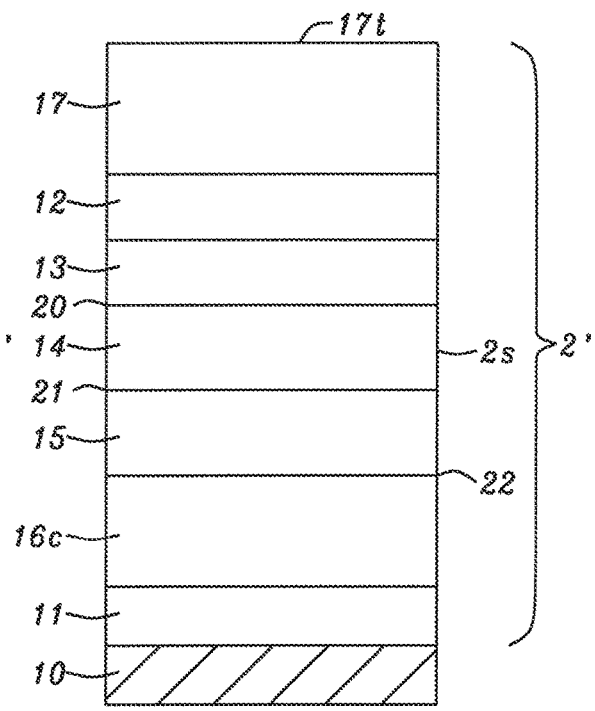
FIG. 8 is a cross-sectional view of a PMA MTJ with a top spin valve design wherein a lattice matching single layer is formed between a Hk enhancing layer and bottom electrode according to an eighth embodiment of the present disclosure.

In another top spin valve embodiment depicted as PMA MTJ 2 with sidewall 2s in FIG. 8, all layers are retained from FIG. 2 where lattice-matching layer 16c is a single layer having a $Co_XFe_YNi_ZL_WM_V$ composition described previously. The present disclosure anticipates that the deposition of a $Co_XFe_YNi_ZL_W$ magnetic material on a M layer may resputter all of the M material which is then co-deposited with the CoFeNiL material. The M material may be uniformly distributed in the CoFeNiLM layer. In other embodiments, there may be a greater M content in a lower portion of layer 16c than in an upper portion that is proximate to Hk enhancing layer 15. The CoFeNiLM layer grows a BCC structure during high temperature annealing proximate to 400° C. and thereby promotes BCC structure growth in the adjoining Hk enhancing layer that enables lattice matching with the BCC growth in free layer 14.

Figure 9:
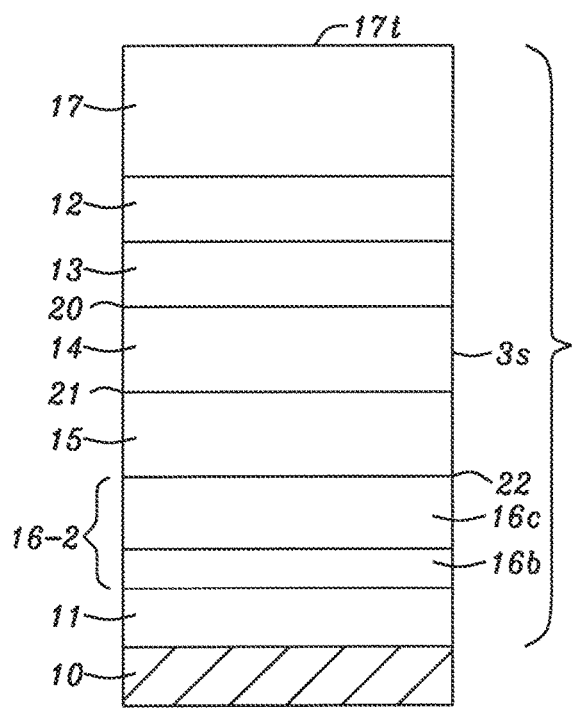
FIG. 9 is a cross-sectional view of a PMA MTJ (top spin valve design) wherein a lattice matching layer with a bilayer stack is formed between a Hk enhancing layer and BE according to a ninth embodiment of the present disclosure.

According to a ninth embodiment of the present disclosure illustrated in FIG. 9, PMA MTJ 3' with sidewall 3s is formed with a top spin valve structure in which all layers are retained from FIG. 7 except there is a lattice matching layer 16-2 having a 16b/16c bilayer stack with a $Co_XFe_YNi_ZL_WM_V$ layer 16c formed on a M layer 16b. In other words, the $Co_XFe_YNi_ZL_W$ layer deposition on the M layer described earlier may be controlled such that only an upper portion of the M layer is resputtered, and is then co-deposited with the $Co_XFe_YNi_ZL_W$ material to yield the $Co_XFe_YNi_ZL_WM_V$ alloy layer 16c. As in the previous embodiment, the CoFeNiLM layer is responsible for promoting BCC structure growth in the adjoining Hk enhancing layer 15. In so doing, the Hk enhancing layer forms a crystal structure matching that of the free layer 14 and thereby maintains substantial PMA in the free layer during high temperature processing proximate to 400° C. for a plurality of hours. Accordingly, greater Hc and improved thermal stability are realized over prior art PMA MTJ designs.

Figure 10:
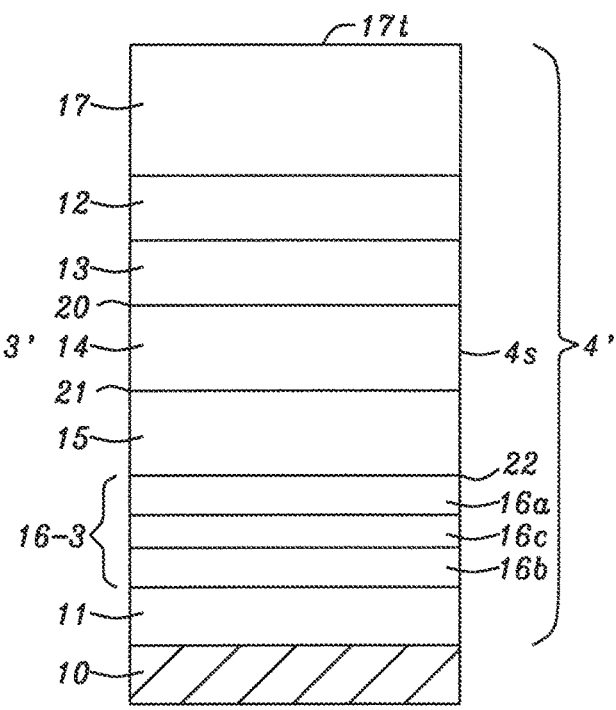
FIG. 10 is a cross-sectional view of a top spin valve PMA MTJ wherein a lattice matching layer with a trilayer structure is formed between a Hk enhancing layer and bottom electrode according to a tenth embodiment of the present disclosure.

Referring to FIG. 10, the present disclosure encompasses a tenth embodiment depicted as PMA MTJ 4' having sidewall 4s where all layers are retained from the top spin valve structure in FIG. 4 except there is a lattice matching layer 16-3 having a trilayer configuration represented by 16b/16c/16a with a M/CoFeNiLM/CoFeNiL stack of layers described previously. Here, the deposition of a $Co_XFe_YNi_ZL_W$ material on a M layer 16b may be controlled such that only an upper portion of the M layer is resputtered to yield a $Co_XFe_YNi_ZL_WM_V$ layer 16c on lower layer 16b. Then, the deposition of the $Co_XFe_YNi_ZL_W$ layer is continued so that a CoFeNiL layer 16a is formed on layer 16c. Here, each of the layers 16a-16c has a thickness from 2 to 10 Angstroms. Thus, a CoFeNiL layer contacts the Hk enhancing layer 15 at interface 22 and is responsible for ensuring a BCC structure is formed in the Hk enhancing layer during an annealing process that comprises a temperature proximate to 400° C. as explained earlier.

Figure 11:
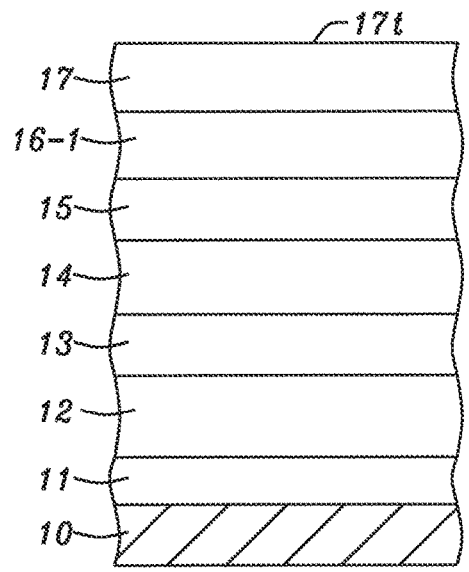
FIGS. 11-14 are cross-sectional views depicting a sequence of steps during the fabrication of a PMA MTJ with a bottom spin valve design according to an embodiment of the present disclosure.

The present disclosure also encompasses a method of forming a PMA MTJ element having a configuration disclosed in one of the embodiments shown in FIGS. 1-10. Referring to FIG. 11, a PMA MTJ stack of layers is formed on a substrate that comprises a bottom electrode layer 10. According to the first bottom spin valve embodiment, the seed layer 11, reference layer 12, tunnel barrier 13, free layer 14, cap layer 15, lattice-matching layer 16-1, and hard mask 17 are sequentially formed on the substrate. It should be understood that lattice-matching layer 16c, 16-2, 16-3, or 16-4 may be substituted for layer 16-1. All layers may be laid down by a sputter deposition technique. In a preferred embodiment, the tunnel layer is formed by depositing a first metal (or alloy) layer, oxidizing the first metal layer with a NOX or ROX method, and then depositing a second metal or alloy layer on the oxidized first metal layer. In some cases, the second metal layer may be oxidized and a third metal layer is deposited on the oxidized second metal layer. Typically, the third metal layer becomes oxidized during a subsequent annealing process by scavenging oxygen from adjoining layers.

Figure 12:
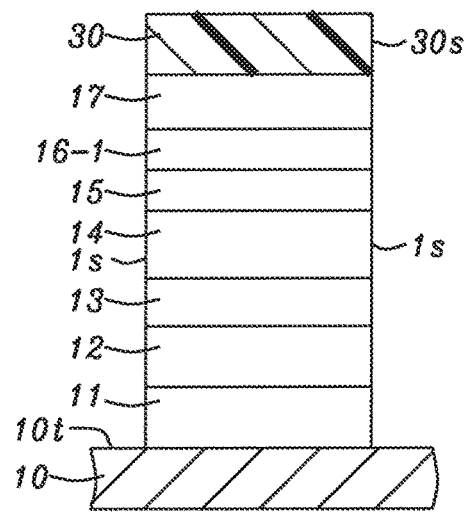

Referring to FIG. 12, a photoresist layer is deposited on a top surface 17t of the hard mask and is patternwise exposed and developed by a conventional method to form a photoresist mask 30 with a top-down view (not shown) in the desired shape of the MRAM, spin-torque MRAM, or spintronic device. Thereafter, an ion beam etch or reactive ion etch is used to transfer the photoresist mask pattern through the underlying layers to form sidewalls is that stop on bottom electrode top surface 10t. In the exemplary embodiment, sidewalls 1s and 50s are formed along a continuous surface that is essentially orthogonal to a top surface of bottom electrode 10. In other embodiments, sidewall 1s may be aligned with a slope such that the seed layer has a greater width in the x-axis direction than hard mask 17. Here, the thickness of each PMA MTJ layer is related to a distance along the y-axis direction. Preferably, the free layer 14 and reference layer 12 have a magnetization either in the (+) y-axis or (−) y-axis direction.

Figure 13:
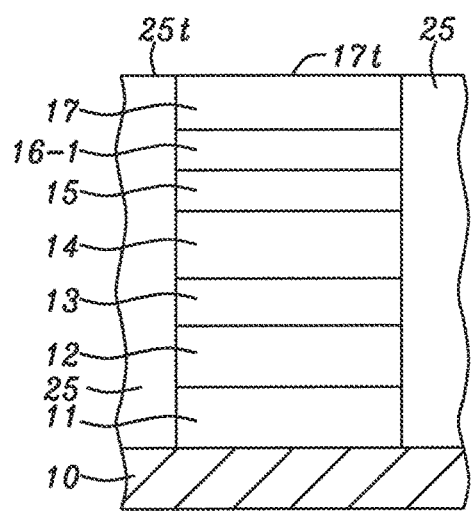

Referring to FIG. 13, an insulation layer 25 such as alumina or $SiO_2$ is deposited on top surface 10t and sidewall 1s to a thickness at least equal to that of the PMA MTJ stack of layers. Then, a chemical mechanical polish (CMP) process is performed to remove the photoresist mask and form a top surface 25t on the insulation layer that is coplanar with top surface 17t of the hard mask layer in the PMA MTJ. The PMA MTJ is now considered to be a nanopillar because the structure resembles a pillar with lateral dimensions along the x-axis and z-axis, and a thickness in the y-axis direction. From a top-down view (not shown), the MTJ nanopillar may have a circular, elliptical, or polygonal shape.

Figure 14:
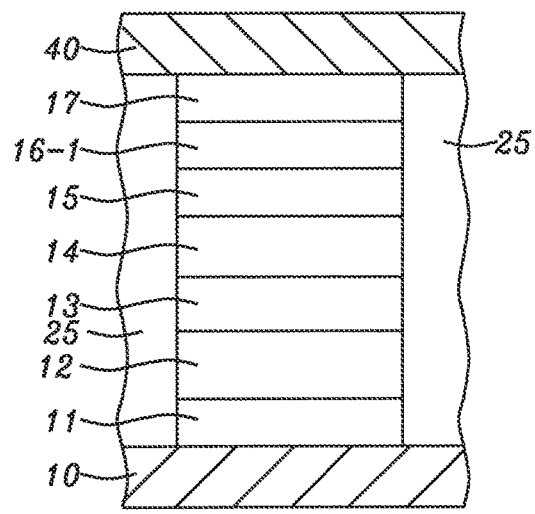

Thereafter in FIG. 14, a top electrode layer is formed in a second insulation layer (not shown) by a well-known process to complete the MRAM, spin-torque MRAM, or STO fabrication sequence. Top electrode 20 contacts a top surface of hard mask 17 and is usually one in a plurality of parallel lines that are formed in a MRAM array and typically comprises Cu or another efficient electrical conductor. In some embodiments, a cladding layer (not shown) is formed around the conductive layer. Only one top electrode is shown in order to simplify the drawing and focus on the PMA MTJ structure that is the key feature of the present disclosure. For STT-MRAM, a current is directed through the PMA MTJ between the top electrode and bottom electrode 10 for reading or writing purposes. In a MRAM write process, a current in the top electrode and bottom electrode generates a magnetic field on the PMA MTJ that is capable of switching the magnetization direction in the free layer. In STO devices, the bottom electrode may be a main pole while the top electrode is a trailing shield as appreciated by those skilled in the art.

Formation of a PMA MTJ with a top spin valve design such as one depicted in FIGS. 6-10 follows the same process flow represented in FIGS. 11-14 with the exception that the order of the PMA MTJ layers is changed. In particular, an optional seed layer 11, lattice matching layer 16-1 (or 16c, 16-2, 16-3, 16-4), Hk enhancing layer 15, free layer 14, tunnel barrier 13, reference layer 12, and hard mask 17 are sequentially formed on a bottom electrode 10 before sidewall 1s (or 2s, 3s, 4s, or 5s) is generated by employing a photoresist patterning and etch process previously described with respect to FIG. 10.

To demonstrate the benefits of a lattice-matching layer according to the present disclosure, patterned PMA MTJ nanopillars were fabricated as circular 90-100 nm MRAM devices and the Hc field for each was measured. Reference PMA MTJ A has a seed layer/reference layer/MgO tunnel barrier/free layer/MgO cap layer/Ru/Ta/TiN configuration wherein the reference layer and free layer are CoFeB based materials, the tunnel barrier and cap layer are MgO, and the hard mask is a Ru/Ta/TiN stack. PMA MTJ B is formed according to an embodiment of the present disclosure and differs from the reference only by including a lattice-matching layer having a CoFeB/Mo configuration between the cap layer and hard mask. All structures were deposited at room temperature and subjected to a first anneal at 330° C. for 30 minutes. A baseline coercivity measurement indicated Hc=3200 Oe for both samples. Then a second anneal was performed at 400° C. for 151 minutes before a second coercivity measurement was taken. As shown in Table 1, Hc for MTJ A is undesirably reduced to 1600 Oe after the second anneal while PMA MTJ B has a Hc of 3200 Oe that is essentially unchanged compared with the first measurement. In some applications, a minimum Hc of ≥3200 Oe is required after high temperature anneal. In addition, it is important that Hc should be maintained for at least two hours during a 400° C. anneal. Note that 400° C. is an industry standard for semiconductor manufacturing to reduce the defect rate of the product and therefore becomes a requirement for embedded MRAM applications.

TABLE 1

Results for PMA MTJs with CoFeB/MgO/CoFeB/cap layer/LM/hard mask configurations

| MTJ | Cap layer | Lattice-matching (LM) layer 1 | Lattice-matching (LM) layer 2 | Fail rate after 260° C., 90 sec. | Hc (Oe) after 400° C., 151 sec |
|---|---|---|---|---|---|
| A | MgO | None | None | 50% | 1600 |
| B | MgO | CoFeB (5 Angs.) | Mo (5 Angstroms) | 1 ppm | 3200 |

The benefits of the present disclosure are improved PMA (Hc and Hk) for a free layer in a magnetic device that will increase the retention time for a memory element such as a PMA MTJ following high temperature processing up to 400° C. that is required for MRAM or STT-MRAM devices integrated in CMOS structures. Furthermore, the processes and materials described herein are compatible with the design and processing requirements of magnetic devices. The fabrication of a MTJ according to an embodiment of this disclosure is not expected to significantly impact the manufacturing cost.

While this disclosure has been particularly shown and described with reference to, the preferred embodiment thereof, it will be understood by those skilled in the art that various changes in form and details may be made without departing from the spirit and scope of this disclosure.

What is claimed is:

1. A method comprising:
    providing a stack of layers that includes a reference layer, a tunnel barrier, and a free layer;
    forming an oxide layer on the free layer;
    forming a lattice-matching layer on the oxide layer;
    forming a hard mask on the first lattice-matching layer; and
    annealing the lattice-matching layer so that the lattice-matching layer grows a body centered cubic (BCC) structure.

2. The method of claim 1, wherein the lattice-matching layer includes non-magnetic metals or alloys.

3. The method of claim 1, wherein the lattice-matching layer includes non-magnetic metals or alloys of M, and
    wherein M is selected from the group consisting of Mo, Mg, Ta, Cr, W, Ru and V.

4. The method of claim 1, wherein the lattice-matching layer includes a material having a composition denoted as $Co_xFe_yNi_zL_w$,
    wherein (x+y) is greater than zero, wherein w is greater than zero, and wherein (x+y+z+w) is equal to 100 atomic %, and
    wherein L is a material selected from the group consisting of B, Zr, Nb, Hf, Mo, Cu, Cr, Mg, Ta, Ti, Au, Ag, and P.

5. The method of claim 1, wherein the lattice-matching layer includes a material having a composition denoted as $Co_xFe_yNi_zL_wM_v$,
    wherein (x+y) is greater than zero, wherein each of v and w is greater than zero, and wherein (x+y+z+w+v) is equal to 100 atomic %,
    wherein M is material selected from the group consisting of Mo, Mg, Ta, Cr, W, Ru, and V, and
    wherein L is a material selected from the group consisting of B, Zr, Nb, Hf, Mo, Cu, Cr, Mg, Ta, Ti, Au, Ag and P.

6. The method of claim 1, wherein the oxide layer includes a material selected from the group consisting of MgTaOx, MgO, SiOx, SrTiOx, BaTiOx, CaTiOx, LaAlOx, MnOx, VOx, $Al_2O_3$, TiOx, BOx, and HfOx.

7. The method of claim 1, wherein the lattice-matching layer includes a material that is an oxide or nitride of Ru, Ta, Ti, or Si.

8. A method comprising:
    forming a lattice-matching layer on a substrate;
    forming an oxide layer on the substrate;
    forming a free layer on the substrate, the free layer interfacing with the oxide layer;
    forming a tunnel barrier layer on the substrate, the tunnel barrier layer interfacing with the free layer;
    forming a reference layer on the on the substrate, the reference layer interfacing with the tunnel barrier layer;
    forming a hard mask layer on the substrate to form a stack of layers that includes the hard mask layer, the reference layer, the tunnel barrier layer, the free layer, the oxide layer and the lattice-matching layer; and
    annealing the stack of layers so that the lattice-matching layer grows a body centered cubic (BCC) structure.

9. The method of claim 8, wherein the lattice-matching layer includes non-magnetic metals or alloys of M, and wherein M is selected from the group consisting of Mo, Mg, Ta, Cr, W, Ru and V.

10. The method of claim 8, wherein the lattice-matching layer includes a material having a composition denoted as $Co_xFe_yNi_zL_w$,
wherein (x+y) is greater than zero, wherein w is greater than zero, and wherein (x+y+z+w) is equal to 100 atomic %, and
wherein L is a material selected from the group consisting of B, Zr, Nb, Hf, Mo, Cu, Cr, Mg, Ta, Ti, Au, Ag, and P.

11. The method of claim 8, wherein the lattice-matching layer includes a material having a composition denoted as $Co_xFe_yNi_zL_wM_v$,
wherein (x+y) is greater than zero, wherein each of v and w is greater than zero, and wherein (x+y+z+w+v) is equal to 100 atomic %,
wherein M is material selected from the group consisting of Mo, Mg, Ta, Cr, W, Ru, and V, and
wherein L is a material selected from the group consisting of B, Zr, Nb, Hf, Mo, Cu, Cr, Mg, Ta, Ti, Au, Ag and P.

12. The method of claim 8, further comprising forming a seed layer on the substrate, and
wherein forming the lattice-matching layer on the substrate includes forming the lattice-matching layer directly on the seed layer such that the lattice-matching layer interfaces with the seed layer.

13. The method of claim 8, wherein forming the oxide layer on the lattice-matching layer includes forming the oxide layer directly on the lattice-matching layer.

14. The method of claim 8, wherein annealing the stack of layers includes annealing at a temperature of about 400° C.

15. A method comprising:
forming a stack of layers on a substrate, the stack of layers including a reference layer, a tunnel barrier layer, a free layer, an oxide layer and a lattice-matching layer;
annealing the stack of layers so that the lattice-matching layer grows a body centered cubic (BCC) structure; and
patterning the stack of layers to form a magnetic tunnel junction (MTJ) structure.

16. The method of claim 15, wherein the lattice-matching layer includes a first layer having a first material composition and a second layer having a second material composition that is different from the first material composition.

17. The method of claim 16, wherein the lattice-matching layer further includes a third layer having a third material composition that is different from the second material composition.

18. The method of claim 15, wherein annealing the stack of layers includes annealing at a temperature of about 400° C.

19. The method of claim 15, wherein the lattice-matching layer includes a material selected from the group consisting of FeL and CoL, and
wherein L is a material selected from the group consisting of B, Zr, Nb, Hf, Mo, Cu, Cr, Mg, Ta, Ti, Au, Ag, and P.

20. The method of claim 15, further comprising:
forming an insulting layer on the MTJ structure; and
forming an electrode layer on the MTJ structure.

* * * * *